(12) United States Patent
Baggett et al.

(10) Patent No.: US 10,794,694 B2
(45) Date of Patent: Oct. 6, 2020

(54) SHALLOW ANGLE, MULTI-WAVELENGTH, MULTI-RECEIVER, ADJUSTABLE SENSITIVITY ALIGNER SENSOR FOR SEMICONDUCTOR MANUFACTURING EQUIPMENT

(71) Applicant: Axcelis Technologies, Inc., Beverly, MA (US)

(72) Inventors: John F. Baggett, Amesbury, MA (US); Billy Thomas Benoit, Beverly, MA (US); Joe Ferrara, Georgetown, MA (US); Brian Terry, Amesbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 51 days.

(21) Appl. No.: 16/170,085

(22) Filed: Oct. 25, 2018

(65) Prior Publication Data

US 2019/0120617 A1   Apr. 25, 2019

Related U.S. Application Data

(60) Provisional application No. 62/576,791, filed on Oct. 25, 2017.

(51) Int. Cl.
*G01N 21/00* (2006.01)
*G01B 11/27* (2006.01)
(Continued)

(52) U.S. Cl.
CPC .......... *G01B 11/272* (2013.01); *G01B 11/27* (2013.01); *H01L 21/24* (2013.01);
(Continued)

(58) Field of Classification Search
CPC .......... G01N 21/9501; G01N 21/8806; G01N 21/94; G01N 21/956; G01N 21/88
(Continued)

(56) References Cited

U.S. PATENT DOCUMENTS 6,162,008 A   12/2000   Perkins et al.
6,585,908 B2   7/2003   Cardoso
(Continued)

FOREIGN PATENT DOCUMENTS

JP   62243339   10/1987

OTHER PUBLICATIONS

International Search Report and Written Opinion dated Jan. 7, 2019 in connection with International Application No. PCT/US2018/057497.

*Primary Examiner* — Md M Rahman
(74) *Attorney, Agent, or Firm* — Eschweiler & Potashnik, LLC (57) ABSTRACT

A workpiece alignment system is provided has a light emission apparatus that directs a light beam at a plurality of wavelengths along a path at a shallow angle toward a first side of a workpiece plane at a peripheral region. A light receiver apparatus, receives the light beam on a second side opposite the first side. A rotation device selectively rotates a workpiece support. According controller determines a position of the workpiece based on an amount of the light beam received through the workpiece when the workpiece intersects the path. A sensitivity of the light receiver apparatus is controlled based on a transmissivity of the workpiece. A position of the workpiece is determined when the workpiece is rotated based on the rotational position, an amount of the light beam received, the transmissivity of the workpiece, detection of a workpiece edge, and the controlled sensitivity of the light receiver apparatus.

20 Claims, 7 Drawing Sheets

(51) Int. Cl.
*H01L 21/24* (2006.01)
*H01L 21/68* (2006.01)
*H01L 21/67* (2006.01)

(52) U.S. Cl.
CPC ...... *H01L 21/67259* (2013.01); *H01L 21/681* (2013.01); *H01L 21/682* (2013.01)

(58) Field of Classification Search
USPC ..................................................... 356/237.1
See application file for complete search history.

(56) References Cited

U.S. PATENT DOCUMENTS

| | | |
|---|---|---|
| 6,677,602 B1 | 1/2004 | Norton |
| 7,453,160 B2 | 11/2008 | Ray |
| 9,255,894 B2 | 2/2016 | VanHoomissen et al. |
| 10,041,789 B2 | 8/2018 | Baggett |
| 2002/0122163 A1* | 9/2002 | Inoue .................... G03B 27/52 355/55 |
| 2004/0016930 A1* | 1/2004 | Yoshida ................. H01L 22/32 257/79 |
| 2004/0056216 A1 | 3/2004 | Inenaga et al. |
| 2010/0073687 A1* | 3/2010 | Spalding ............ G01B 11/2425 356/625 |
| 2013/0319071 A1* | 12/2013 | Vodnick .................. G01N 3/02 73/1.08 |
| 2014/0111797 A1 | 4/2014 | Kitamura et al. |
| 2014/0272685 A1* | 9/2014 | Sandstrom .......... G03F 7/70425 430/5 |
| 2015/0018622 A1* | 1/2015 | Tesar ...................... A61B 1/05 600/202 |
| 2017/0129039 A1* | 5/2017 | Williams .............. B23K 26/032 |
| 2018/0094921 A1* | 4/2018 | Baggett ................ H01L 21/681 |

\* cited by examiner

SHALLOW ANGLE, MULTI-WAVELENGTH, MULTI-RECEIVER, ADJUSTABLE SENSITIVITY ALIGNER SENSOR FOR SEMICONDUCTOR MANUFACTURING EQUIPMENT

REFERENCE TO RELATED APPLICATIONS

This application is a U.S. Non-Provisional Application which claims the benefit of U.S. Provisional Application Ser. No. 62/576,791 filed Oct. 25, 2017, entitled "SHALLOW ANGLE, MULTI-WAVELENGTH, MULTI-RECEIVER, ADJUSTABLE SENSITIVITY ALIGNER SENSOR FOR SEMICONDUCTOR MANUFACTURING EQUIPMENT", the contents of which are herein incorporated by reference in their entirety.

FIELD

The present disclosure relates generally to workpiece processing systems and methods for processing workpieces, and more specifically to a system and method for handling and aligning workpieces having varying light transmission properties.

BACKGROUND

In semiconductor processing, many operations may be performed on a single workpiece or semiconductor wafer. In many processing operations, a particular orientation of the workpiece and/or knowledge of the position of the workpiece with respect to a workpiece holder is needed in order to properly process or handle the workpiece. For example, operations such as an exchange of workpieces between transport carriers or storage cassettes and the processing system and a transfer of the workpieces from an atmospheric environment into an evacuated environment of a process chamber of the processing system through one or more load lock chambers may require specific orientation(s) or knowledge of the spatial position of the workpiece for proper workpiece handling and processing.

An orientation of the workpiece (e.g., notch alignment) may be performed within the evacuated environment or atmospheric environment via a light presence sensor, whereby a beam of light is emitted by a light emitter and directed toward the workpiece concurrent to a rotation of the workpiece with respect to the beam of light. A variation in light received by a light receiver can be then used to determine the position of a notch defined in the workpiece and/or an eccentricity of a position of the workpiece, depending on how the light is fully or partially received. One such system is disclosed in U.S. Pat. No. 5,740,034 to Hiroaki Saeki, whereby a waveform associated with the received light signals is utilized to determine the position of the notch and/or eccentric position of the workpiece.

SUMMARY

The present disclosure advantageously overcomes the limitations of the prior art by providing a system, apparatus, and method for accurately determining the positions of workpieces having various transmissivities, thereby improving accuracy and minimizing costs of ownership associated with the systems. More particularly, the present disclosure provides a system and method for advantageously determining a position of a birefringent workpiece utilizing various polarizing filters. The present disclosure thus provides a positioning solution for practically any substrate material and thickness, regardless of various coatings or properties of the substrate.

Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the disclosure in a simplified form as a prelude to the more detailed description that is presented later.

In accordance with one exemplary aspect of the disclosure, a workpiece alignment system is provided. The workpiece alignment system, for example, comprises a light emission apparatus configured to direct a beam of light at a plurality of wavelengths along a path toward a first side of a workpiece plane associated with a workpiece. The path, for example, is associated with a peripheral region of the workpiece, wherein the path is at a shallow angle with respect to the workpiece plane.

A light receiver apparatus, for example, is positioned along the first path, wherein the light received apparatus is configured to receive the beam of light on a second side of the workpiece plane, wherein the second side is generally opposite the first side. A workpiece support is further provided and configured to selectively support the workpiece along the workpiece plane. In one example, a rotation device is operably coupled to the workpiece support, wherein the rotation device is configured to selectively rotate the workpiece support about a support axis associated therewith.

According to one example, a controller is further provided and configured to determine a position of the workpiece based on an amount of the beam of light that is received through the workpiece by the light receiver apparatus when the workpiece intersects the path. The controller, for example, is configured to control a sensitivity of the light receiver apparatus based on a transmissivity of the workpiece, wherein the controller is further configured to determine a position of the workpiece with respect to the support axis when the workpiece is supported and rotated via the workpiece support. The determination of the position of the workpiece, for example, is based, at least in part, on a rotational position of the workpiece support, at least a portion of the beam of light received by the light receiver apparatus associated with the rotational position of the workpiece support, the transmissivity of the workpiece, a detection of an edge of the workpiece, and the controlled sensitivity of the light receiver apparatus.

In accordance with one example, the light emission apparatus is configured to transmit the beam of light at the plurality of wavelengths across a predetermined width. In another example, the light emission apparatus is a laser configured to transmit the beam of light at the plurality of wavelengths.

The position of the workpiece, for example, can comprises a two-dimensional offset of a center of the workpiece from the support axis along the workpiece plane. In another example, the position of the workpiece comprises a rotational position of the workpiece about the support axis.

In another example, the rotational position of the workpiece about the support axis is associated with an edge feature of the workpiece. The controller, for example, may be further configured to determine the position of the workpiece with respect to the support axis based on the edge feature of the workpiece.

The controller, for example, may be configured to determine a waveform, wherein the waveform is defined by the at least a portion of the beam of light received by the light receiver at a plurality of rotational positions of the workpiece support. The controller may be further configured to determine the position of the workpiece with respect to the support axis based on the waveform. In one example, the controller is further configured to proportion the waveform based on the transmissivity of the workpiece.

In another example, the controller may be configured to determine the edge of the workpiece by ignoring one or more signals along a width of the light receiver apparatus. For example, the controller may be configured to ignore one or more signals beyond a sensed blockage of the light along the width of the light receiver apparatus.

In accordance with another example, a method for aligning a workpiece is provided. The method, for example, comprises placing a workpiece on a workpiece support and directing a beam of light at a plurality of wavelengths toward a first side of the workpiece along first path, wherein the path is at a shallow angle with respect to a plane of the workpiece. The workpiece is rotates about a support axis, and the beam of light that is transmitted toward the workpiece is received at a second side of the workpiece concurrent with the rotation of the workpiece. Further, a position of the workpiece with respect to the support axis is determined based, at least in part, on a rotational position of the workpiece about the support axis and the beam of light that is received, a detection of an edge of the workpiece, and a controlled sensitivity of the beam of light.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

In semiconductor processing, many operations may be performed on a single workpiece or semiconductor wafer. In general, each processing operation on a workpiece is typically performed in a particular order, wherein each operation waits until completion of a preceding operation. In many processing operations, a particular orientation of the workpiece and/or knowledge of the position of the workpiece with respect to a workpiece holder is needed in order to properly process or handle the workpiece. For example, operations such as an exchange of workpieces between transport carriers or storage cassettes and the processing system and a transfer of the workpieces from an atmospheric environment into an evacuated environment of a process chamber of the processing system through one or more load lock chambers may require specific orientation(s) or knowledge of the spatial position of the workpiece for proper workpiece handling and processing.

An orientation of the workpiece (e.g., notch alignment) may be performed within the evacuated environment or atmospheric environment via a light presence sensor, whereby a beam of light is emitted by a light emitter and directed toward the workpiece concurrent to a rotation of the workpiece with respect to the beam of light. A variation in light received by a light receiver can be then used to determine the position of notch defined in the workpiece and/or an eccentricity of a position of the workpiece, depending on how the light is fully or partially received.

Such positioning via light presence sensors has been adequate for accurately determining the position of a workpiece that is opaque to the light emitted, such seen in conventional silicon substrates. However, when substrates or workpieces undergoing processing differ materially from one another (e.g., silicon versus silicon carbide), the use of a conventional light presence sensor and aligner can lead to various errors in positioning, specifically when the substrate is partially transparent to the light emitted. For example, a difference in transmission through the wafer can lead to significant errors in positioning using conventional alignment systems and methods. The transmissivity and emissivity can vary from workpiece to workpiece due to coatings or devices disposed on the particular workpiece.

Systems for aligning conventional semiconductor wafers have been developed for silicon wafers, whereby the systems rely on the silicon wafer blocking the passage of light between a light source and sensor, wherein the silicon wafers are opaque to the optical wavelength light source. However, rather than being opaque, wafers comprised of silicon carbide (SiC) transmit light at optical wavelengths and are thus transparent or semi-transparent to the conventional light source. Such transparency can lead to difficulties in sensing and aligning silicon carbide wafers using the systems previously designed for sensing and aligning silicon wafers.

The present disclosure further appreciates that once various processing steps are performed on the silicon carbide wafer, the silicon carbide wafer may be densely covered with films, devices, or metal lines, whereby varying levels of transparency are present, thus potentially resulting in substantial signal fluctuations.

The present disclosure is thus directed generally toward a workpiece handling system for semiconductor processes, and more particularly, to an alignment apparatus configured to characterize and/or align workpieces having varying light transmission properties.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In general, an aligner comprises a light emitter and a light receiver, whereby the light emitter directs a beam of light toward an edge of a workpiece, whereby the aligner further determines an amount of the emitted light that is blocked from reaching the light receiver as the workpiece is rotated about a rotation axis. For example, if a center of the workpiece is offset from the rotation axis of the aligner, variations will be present in the amount of light received by the light receiver as the workpiece blocks varying amounts of the emitted light as the workpiece is rotated. The amount of blocked light, for example, is represented as a percentage of the total light that is emitted. The amount and variation of light received is subsequently converted to a dimension associated with the workpiece (e.g., an offset), whereby, in one example, the dimension is utilized by an end-effector to retrieve the workpiece at the center of the workpiece.

Figure 1:
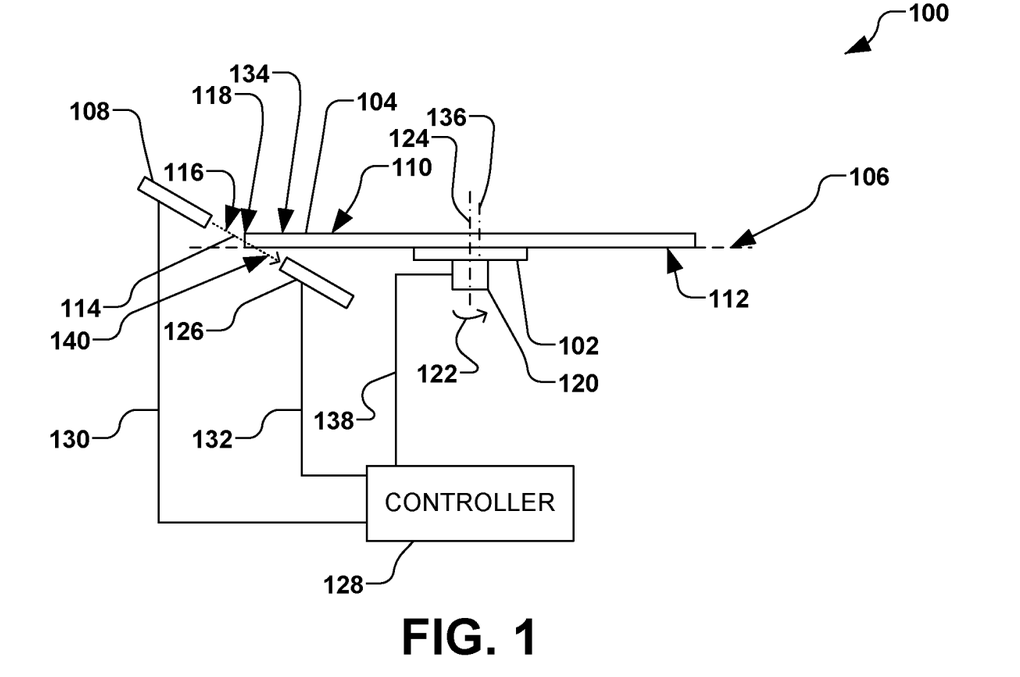
FIG. 1 illustrates a block diagram of an exemplary workpiece alignment system in accordance with an aspect of the present disclosure.

Referring now to the figures, FIG. 1 illustrates an exemplary workpiece alignment system 100 in accordance with one or more aspects of the present disclosure. The workpiece alignment system 100, for example, comprises a workpiece support 102 configured to selectively support a workpiece 104 along a workpiece plane 106. The workpiece support 102, for example, may comprise any number of support mechanisms, such as pins, plates, or other mechanisms (not shown) operable to selectively support the workpiece 104.

In accordance with one exemplary aspect, a light emission apparatus 108 is positioned on one of a first side 110 and a second side 112 of the workpiece plane 106, wherein the light emission apparatus is configured to direct a beam of light 114 along a path 116. The path 116, for example, is associated with a periphery 118 (e.g., a peripheral region or edge) of the workpiece 104.

A rotation device 120 is further operably coupled to the workpiece support 102, wherein the rotation device is configured to selectively rotate (e.g., illustrated by arrow 122) the workpiece support about a support axis 124. The support axis 124, for example, is perpendicular to the workpiece plane 106.

In one particular example, the emission apparatus 108 (e.g., also called a light emission apparatus) is configured to emit a plurality of wavelengths of light. One or more of the plurality of wavelengths of light emitted by the emission apparatus 108, for example, may be determined based on the constituency of the workpiece 104. A receiver apparatus 126 (e.g., also called a light receiver apparatus) is further provided and configured to receive the beam of light 114 concurrent with the rotation of the workpiece support 102 about the support axis 124.

In accordance with several aspects of the present disclosure, the workpiece alignment system 100 further comprises a controller 128, wherein the controller is configured to determine one or more of a position and orientation of the workpiece 104 with respect to the workpiece support 102 based on an initial transmission 130 (e.g., transmitted amount) of the beam of light 114 and a received signal 132 associated with the beam of light and that is received (e.g., passing by and/or through the workpiece) by the light receiver apparatus 126. For example, the received signal 132 of the beam of light 114 is based, at least in part on one or more of a material constituency of the workpiece 104, one or more layers (not shown) formed on the workpiece, one or more devices (not shown) formed on the workpiece, and one or more operations previously performed on the workpiece, such as a previous ion implantation or other semiconductor process previously performed on the workpiece.

According to another example, the controller 128 is further configured to determine a position 134 of the workpiece 104 with respect to the support axis 124. It should be noted that the controller 128, for example, may comprise multiple individual controllers (not shown) associated with various components of the processing system, or may be a single controller for the whole system, and all such controllers are contemplated as falling within the scope of the present disclosure.

Figure 2:
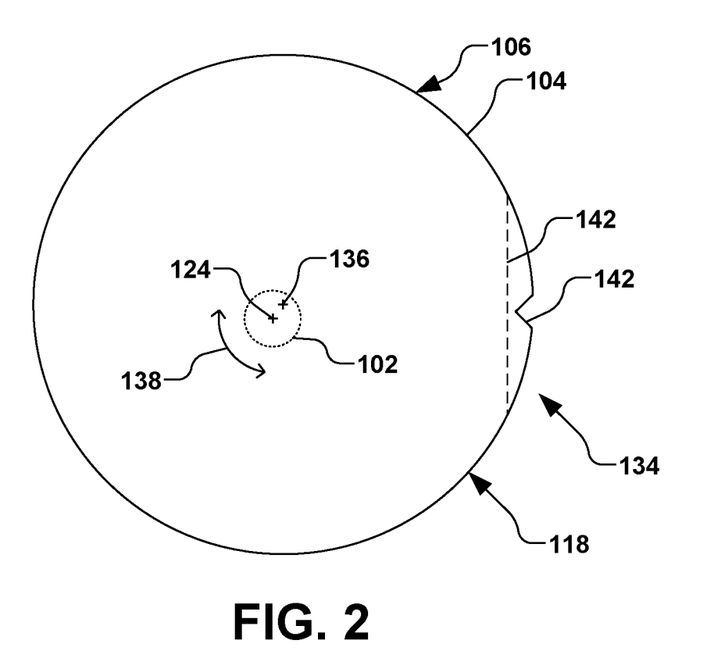
FIG. 2 is a plan view of an exemplary workpiece on a workpiece support of an exemplary alignment mechanism.

The position 134 of the workpiece 104, for example, may be determined by the controller 128, whereby the controller is configured to determine a center 136 of the workpiece 104 with respect to the support axis 124 of the workpiece support 102, as illustrated in FIG. 2. For example, as illustrated in FIG. 1, the determination of the position 134 of the workpiece 104 with respect to the support axis 124 is based, at least in part, on a rotational position 138 of the workpiece support 102, and the received signal 132 indicative of a portion 140 of the beam of light 114 that is received by the light receiver apparatus 126.

The portion 140 of the beam of light 114 that is received by the light receiver apparatus 126, for example, is associated with the rotational position 138 of the workpiece support 102. In one example, the position 134 of the workpiece 104 that is determined by the controller 128 comprises a two-dimensional offset of the center 136 of the workpiece from the support axis 124 along the workpiece plane 106, as illustrated in FIG. 2. The position 134 of the workpiece 104 may further comprise the rotational position 138 of the workpiece 104 or workpiece support 102 about the support axis 124, wherein the rotational position of the workpiece about the support axis is associated with an edge feature 142 of the workpiece, and wherein the controller 128 of FIG. 1 is further configured to determine the position of the workpiece with respect to the support axis based on the edge feature of the workpiece. The edge feature 142 of FIG. 2, for example, may comprise a notch, flat, or other feature associated with a periphery 118 of the workpiece 104.

Figure 3:
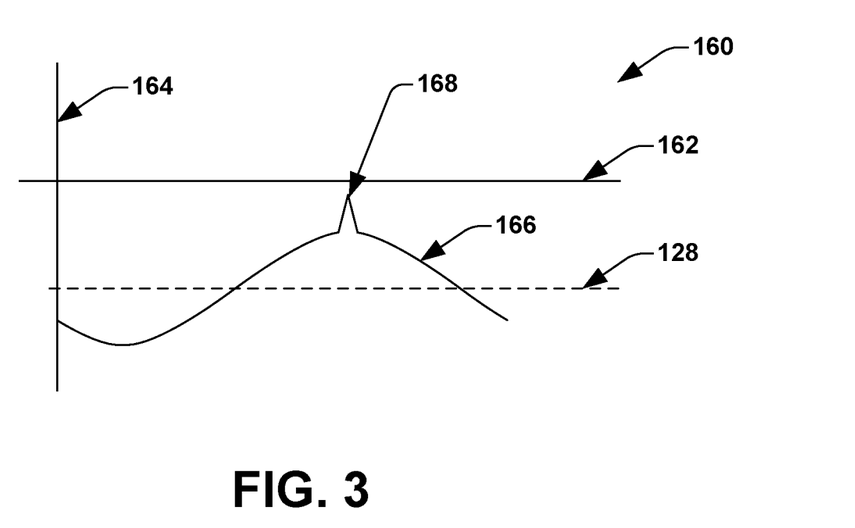
FIG. 3 is a plot of a sensed position of a workpiece versus a rotational position of the workpiece support according to another exemplary aspect of the disclosure.

FIG. 3, for example, illustrates a plot 160 of a rotational position 162 (e.g., provided by a servo motor or other apparatus associated with the rotation device 120 of FIG. 1) versus the output 164 from the light receiver apparatus 126 of FIG. 1, wherein the center 136 of the workpiece 104 can be extrapolated from an output signal curve 166 (from the received signal 132) indicating the passage of the edge feature 142 through the beam of light 114 (e.g., illustrated in FIG. 3 at position 168) and a knowledge of the dimensions of the edge feature.

Figure 4:
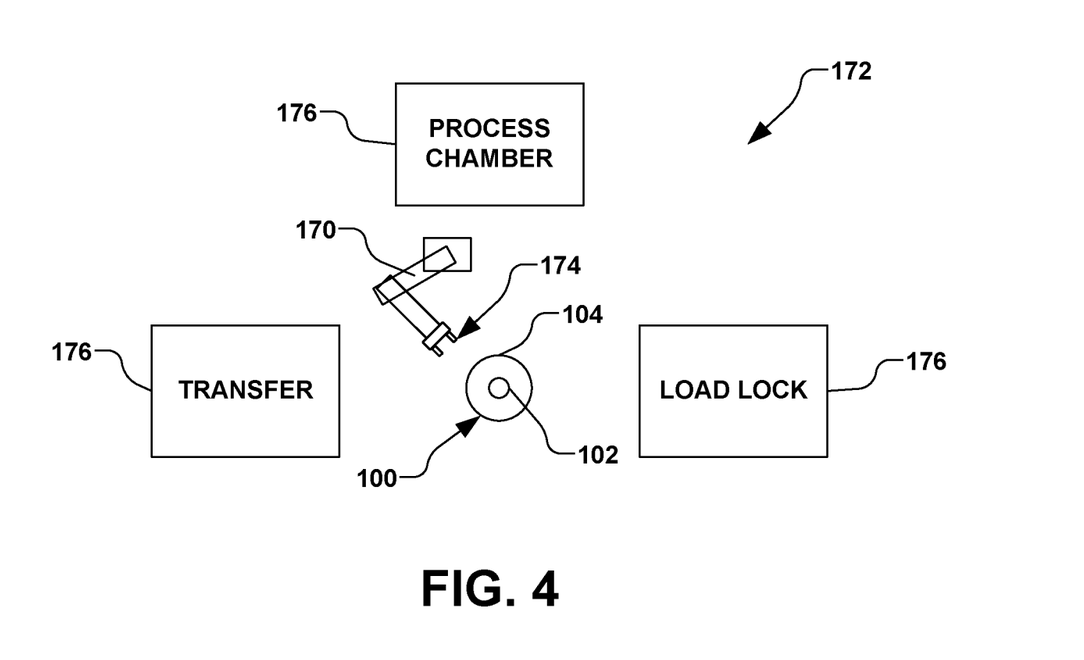
FIG. 4 illustrates the exemplary workpiece handling system incorporating the workpiece alignment system of FIG. 1.

Accordingly, the controller 128 of FIG. 1 can determine an offset vector value associated with the center 136 of the workpiece 104 which can be provided to a robot 170 illustrated in the workpiece handling system 172 of FIG. 4. The robot 170, for example, may be configured to pick the workpiece 104 from the workpiece support 102 based on the offset vector value, whereby the workpiece is generally centered with respect to a support member 174 when it is picked from workpiece alignment system 100 of FIG. 1. The rotational position of the workpiece 104 can be further utilized to rotationally align the workpiece with respect to the workpiece alignment system 100 prior to being picked by the robot 170 and transferred to one or more stations 176, such as a process chamber, load lock chamber, transfer system, or other apparatus utilized in processing of the workpiece.

Silicon carbide (SiC) wafers used in semiconductor processing are semi-transparent and conventional aligner sensors (e.g., a 10 mm sensor produced by Omron) can yield inconsistent results, thus causing wafer handling errors and aligner failures. These issues are more prominent with device wafers and when the wafers are more transparent. Since SiC is semi-transparent, the 650 nm light from conventional sensors can pass through the bulk of the material, providing inconsistent results to a conventional receiver. Such failures occur more frequently when devices are formed or otherwise present on the wafer, since the device will block part of the light, while the portion of the wafer without devices present will allow the light through. This produces substantial fluctuations in the signal read-back, making it difficult for the fit curve and algorithm to find the wafers center and orientation using conventional aligners.

The present disclosure utilizes an aligning sensor configured to produce a wide, multi-wavelength beam of light in conjunction with an edge detect scheme, wherein a sensitivity of the aligning sensor is further adjustable. The aligning sensor is further oriented at a substantially shallow angle relative to the workpiece, whereby the aligning sensor of the present disclosure results in increased stability of signal read-back.

Accordingly, the present disclosure provides a multi-wavelength edge detect sensor with adjustable sensitivity for a workpiece comprising transparent or semi-transparent materials. The sensor is mounted at a shallow angle relative to the workpiece for increased intersection length. The light emission apparatus 108 of FIG. 1, for example, is configured to emit multiple wavelengths of light (e.g., multiple wavelengths of laser light), whereby the multiple wavelengths ameliorate issues associated with the material consistency of the workpiece 104 being opaque or transparent to a single wavelength of light. The light receiver apparatus 126 (e.g., one or more light receivers) is thus configured to receive the multiple wavelengths of light to determine the distance from the edge of the light emission apparatus 108 to the edge or periphery 118 of the workpiece 104, and to ignore any light that passes through the workpiece and is received by the light receiver apparatus.

Thus, a stable read-back is provided by the present disclosure, even with varying transparency across the workpiece 104. The edge of a transparent object, such as the workpiece 104, for example, may have lower transmissivity properties than the bulk or remainder of the object. As such, the sensitivity of the light receiver apparatus may be adjusted or otherwise controlled to identify the edge or periphery 118 of the workpiece 104, and to ignore the bulk or remaining interior portions, thus resulting in more stable signals associated with the edge detection. Furthermore, by positioning the light receiver apparatus 126 (e.g., a sensor) at a shallow angle relative to the workpiece 104, the light 114 (e.g., laser light) is thus transmitted through a longer length or cross-section of the workpiece, resulting is less of the light transmitting through to the light receiver apparatus 126. Thus, a signal intensity difference is advantageously increased between a situation when the light 114 passes through a quasi-transparent portion of the workpiece and when the light does not intersect the workpiece, thus providing a more accurate and repeatable mechanism for identifying the position of the workpiece.

Figure 5:
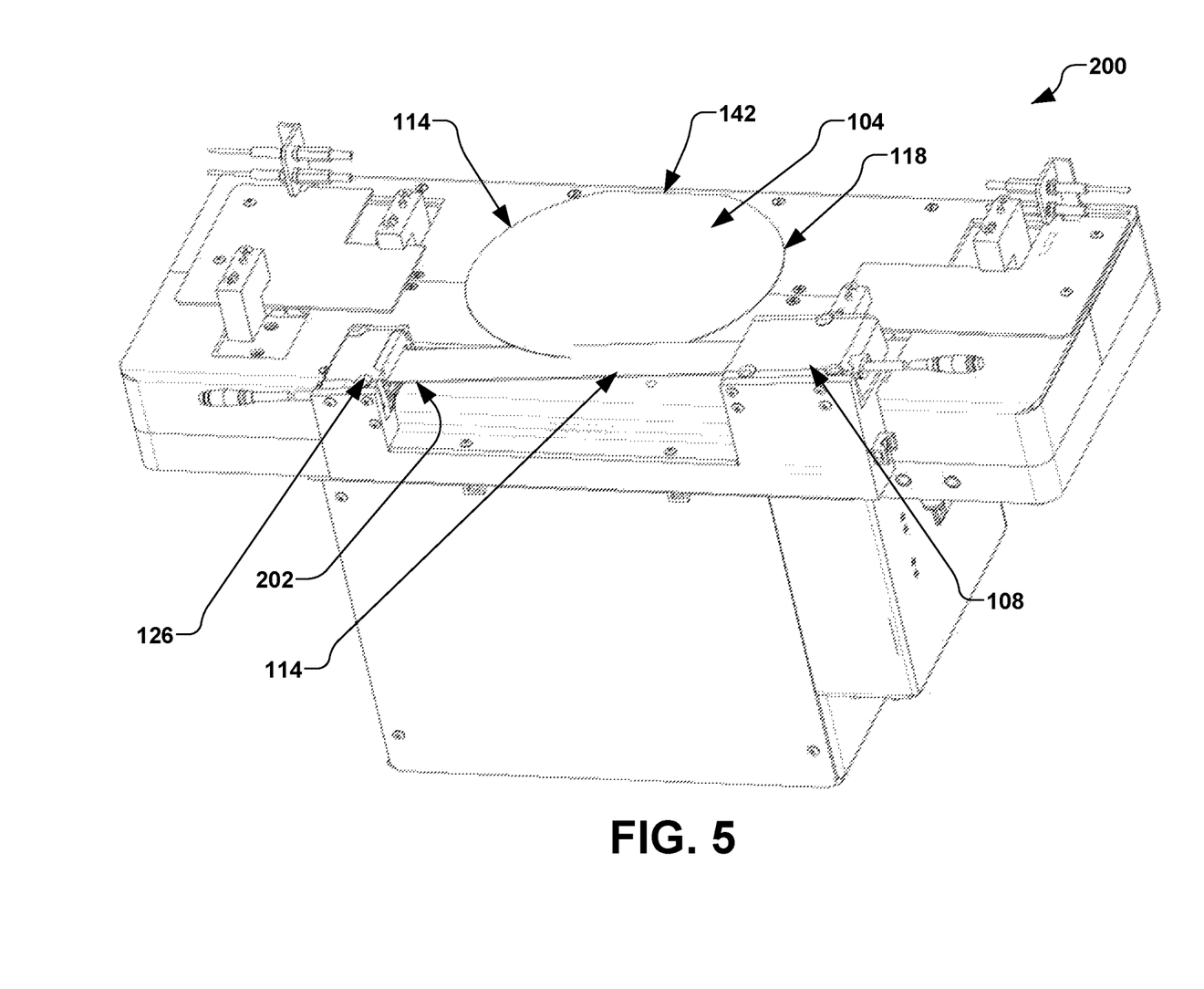
FIG. 5 illustrates a perspective view of an exemplary workpiece alignment system in accordance with an aspect of the present disclosure.
Figure 6:
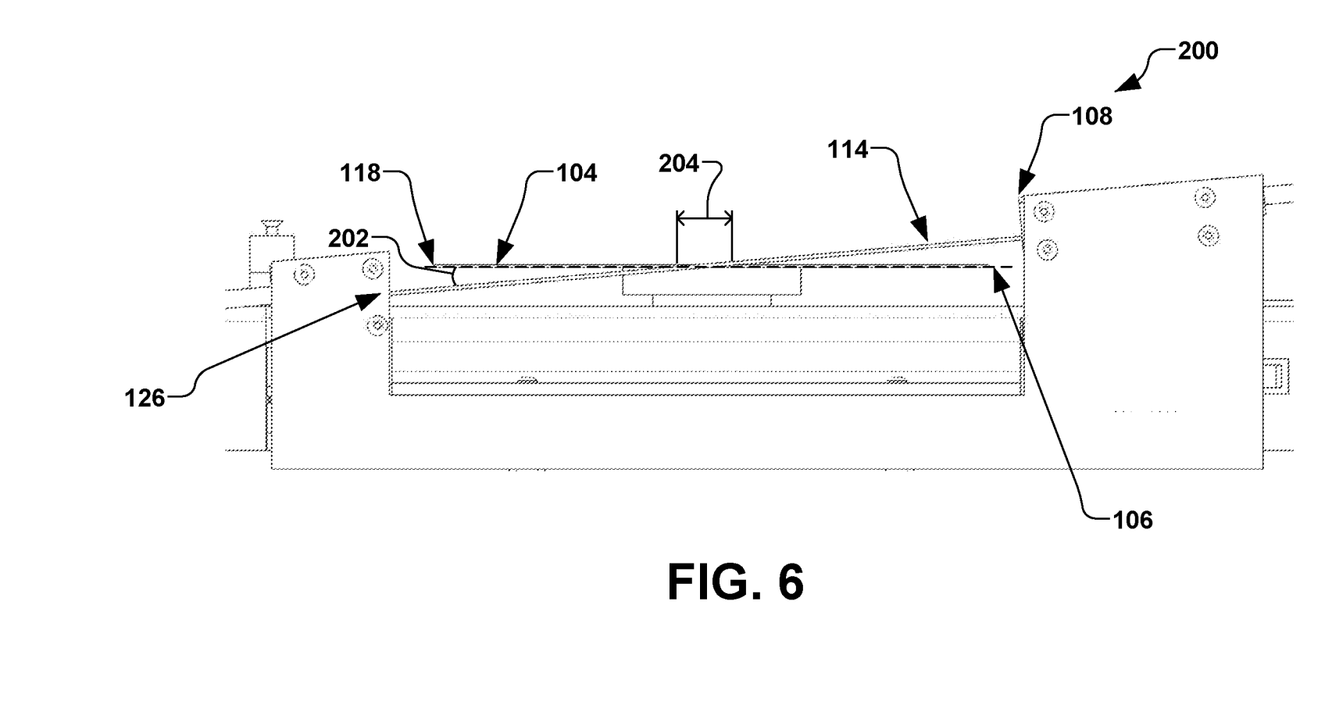
FIG. 6 illustrates a side view of an exemplary light beam passing by a workpiece in accordance with an aspect of the present disclosure.

Accordingly, the present disclosure provides a multiple-wavelength, multiple-receiver, adjustable sensitivity alignment apparatus 200, as illustrated in the example shown in FIG. 5, whereby the emission apparatus 108 and receiver apparatus 126 are mounted at a shallow angle 202 relative to the workpiece 104 (also called a wafer). Accordingly, due to the shallow angle 202, a larger thickness of the workpiece 104 is permitted to block the light 114, as illustrated in FIG. 6, such that the signal read-back is smooth and consistent. Multiple wavelengths of light 114, for example, are respectively emitted and received by the emission apparatus 108 and receiver apparatus 126 of the alignment apparatus 200. For example, various materials are transparent to different wavelengths of light 114 based on the material properties. By using multiple wavelengths, the possibility of a particular material to be completely transparent to a single wavelength is mitigated by the remaining wavelengths of light 114 emitted and received by the alignment apparatus 200. The multiple wavelengths, for example, are used to determine changes in how the light 114 is received for the different wavelengths.

Accordingly, a plurality of wavelengths of light are transmitted and received by the emission apparatus 108 and receiver apparatus 126, and the change in light intensity (e.g., a percentage of light received) over the plurality of wavelengths is identified. By examining the plurality of wavelengths and identifying the wavelengths that change in intensity values, a determination can be made as to whether the material is opaque to a particular wavelength, even if the other intensities remain constant.

The present disclosure advantageously provides the emission apparatus 108 and receiver apparatus 126 at the shallow angle 202 with respect to the workpiece plane 106 of the workpiece 104, as opposed to conventional sensors where the light passes through the wafer at approximately 60-90 degrees from the workpiece plane. The shallow angle 202, for example, can be less than approximately 30 degrees with respect to the workpiece plane 106. By providing a shallow angle 202 illustrated in FIG. 6, (e.g., intersecting the workpiece 104 at approximately 5 degrees from the workpiece plane 106), the light 114 passes through a length 204 of the workpiece that is significantly larger than if the light were to be directed perpendicular to the workpiece plane 106. For example, even if the workpiece 104 is 10-30% transparent to the light 114 emitted by the emission apparatus 108, increasing the length 204 of the workpiece through which that the light passes advantageously increases the sensitivity of the apparatus 200.

Further, in conjunction with the multiple wavelengths of the light 114 and the shallow angle 202 at which the emission apparatus 108 and receiver apparatus 126 (collectively called sensors) are positioned, an edge detection feature can be further utilized. The edge detection feature, for example, identifies a first decrease in signal across a predetermined width 206 of the beam of light 114 shown in FIG. 7, and then assumes any light beyond or downstream (e.g., closer to the center 136 of the workpiece 104) is blocked by the workpiece 104. Further, even if a portion 208 of the light 114 passes through a bulk 210 of the material of the workpiece 104, the edge detection feature of the present disclosure can be configured to ignore that portion of light. In the present example, the beam of light 114 formed by the emission apparatus 108 and received by the receiver apparatus is generally ribbon-shaped, as shown in FIGS. 5-7.

Figure 7:
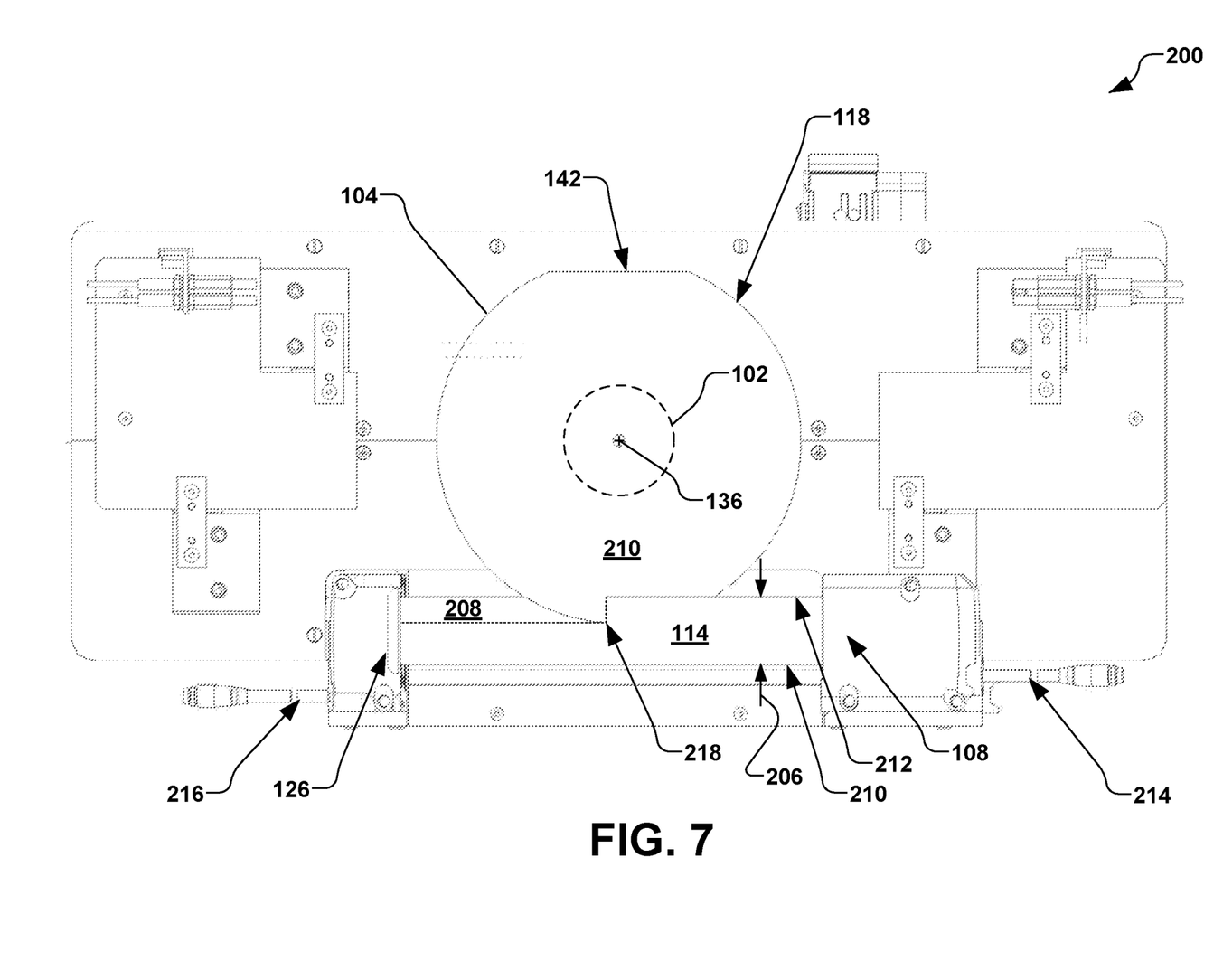
FIG. 7 illustrates a plan view of an exemplary workpiece alignment system showing a light beam passing partially through an edge of a workpiece in accordance with an aspect of the present disclosure.

In one example, the emission apparatus 108 and receiver apparatus 126 shown in FIG. 7 are configured to provide the width 206 of the beam of light 114 from an outboard extent 210 to an inboard extent 212 (e.g., a distance of 28 mm). The emission apparatus 108, for example, is configured to transmit the beam of light 114 at a transmitted signal 214 (e.g., full signal strength or 100% signal) across the width 206 thereof from the outboard extent 210 to the inboard extent 212 toward the receiver apparatus 126. The receiver apparatus 126 is configured to receive the beam of light 114 from the outboard extent 210 to the inboard extent 212 in predetermined increments (e.g., 1 mm increments), such that a received signal 216 is associated with each of the predetermined increments.

In the present example, the received signal 216 of the beam of light 114 received by the receiver apparatus 126 is substantially equal to the first signal 214 (e.g., full signal strength) from the outboard extent 210 to an edge position 218 (e.g., from 0-18 mm) associated with the periphery 118 of the workpiece 104. When the beam of light 114 intersects the workpiece 104 from the edge position 218 to the inboard extent 212 (e.g., from 18 mm-28 mm) the portion 208 of the light 114 that passes through the bulk 210 of the workpiece 104 decreases the received signal 216 accordingly (e.g., signal strength steps down to 80%, 60%, etc. associated with the transmissivity of the workpiece 104).

In one example, the emission apparatus 108 and receiver apparatus 126 have an adjustable sensitivity configured to permit adjustment for a desired trigger point. For instance, if the received signal 216 associated with the beam of light 114 decreases from 100% of the transmitted signal 214 to 50% of the transmitted signal at 18 mm from the outboard extent 210 (e.g., a "step" in the received signal), then the edge position 218 associated with the edge or periphery 118 of the workpiece 104 can be determined to be at 18 mm from the outboard extent 210. Further, such a received signal 216 associated with the edge position 218 can be utilized to calibrate the apparatus 200 such that any received signal from the edge position to the inboard extent 212 (e.g., from 18 mm to 28 mm from the outboard extent 210) can be assumed to be blocked or interrupted by the workpiece 104. Thus, even if the beam of light 114 passes through the bulk 210 of the material of the workpiece 104 and is received at 50% of the transmitted signal 214, the received signal 216 associated therewith can be assumed to be blocked by the workpiece and ignored.

In accordance with another example, as the workpiece 104 is rotated, the edge position 218 can change, whereby the received signal 216 can vary based on the position of the workpiece on the workpiece support 102 (e.g., the center 136 of the workpiece with respect to the support axis 124 of the workpiece support as illustrated in FIG. 2). As such, the controller 128 of FIG. 1 can be configured to determine the edge position 218 of FIG. 7 and/or center 136 of the workpiece 104. Further, for detection of the edge 118 of the workpiece 104, the receiver apparatus 126 can comprise a plurality of receivers configured to respectively determine a percentage of the beam of light 114 received across the multiple receivers, whereby the edge position 218 is determined by differentiating the received signal 216 along the width 206 of the beam of light 114. For example, if the first five of the plurality of receivers of the received apparatus 126 yield a received signal 216 at 100% of the transmitted signal 214, and the sixth of the plurality of receivers decreases in percentage of the transmitted signal, the edge 118 of the workpiece 104 can be determined to have been detected at a position associated with the sixth of the plurality of receivers, and any received signal further toward the inboard extent 212 can be assumed to be blocked by the workpiece.

Figure 8:
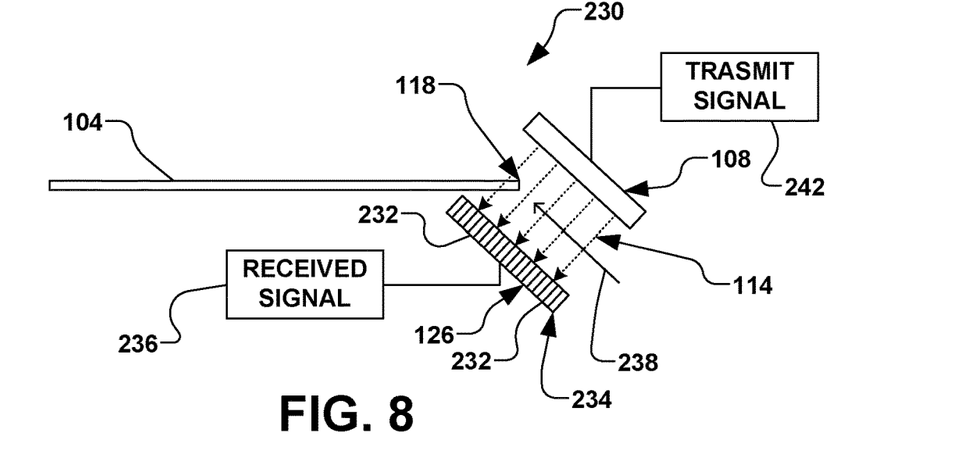
FIG. 8 illustrates a block diagram of an exemplary sensor arrangement in accordance with an aspect of the present disclosure.
Figure 9A:
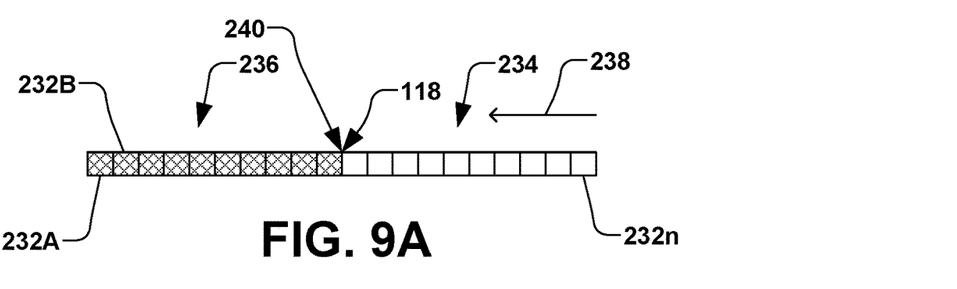
FIGS. 9A-9C illustrate various sensor output signals in accordance with various aspects of the present disclosure.
Figure 9B:
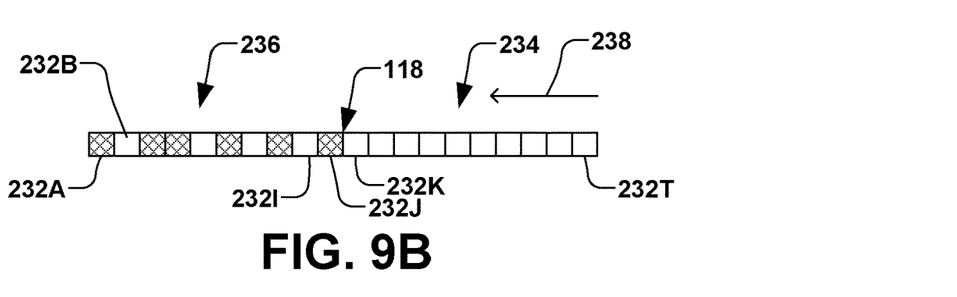
Figure 9C:
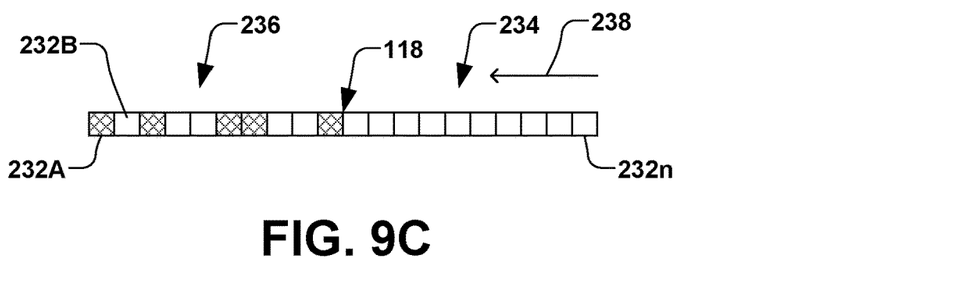

FIG. 8 further illustrates another example, whereby a sensor apparatus 230 comprises the emission apparatus 108 and receiver apparatus 126. In the present example, the receiver apparatus 126 comprises a plurality of sensor cells 232 disposed in an array 234 configured to provide a respective plurality of signals 236. FIGS. 9A-9C illustrate examples of the plurality of signals 236 associated with several workpieces 104 of FIG. 8 having various transmissivities, whereby the plurality of signals are viewed when progressing in the direction of arrow 238 (e.g., the sensor apparatus 230 is stationary and has the plurality of sensor cells 232A-232*n* disposed across a 28 mm span, where n=any positive integer).

FIG. 9A illustrates an example of the plurality of signals 236 for a workpiece 104 of FIG. 8, wherein the workpiece is opaque (e.g., light does not transmit through the workpiece). The edge 118 of the workpiece 104 is indicated in the present example as being at a location 240 that is half way between the array 234 of sensor cells 232A . . . 232*n*, whereby half of the sensor cells are "on" (sensor cells that are shown as unshaded for illustration purposes) and half are "off" (sensor cells that are shown as shaded for illustration purposes).

FIG. 9B illustrates an example of the plurality of signals 236 for another workpiece 104 of FIG. 8, wherein the workpiece is comprised of transparent materials or material(s) having varying transparencies, such as a silicon carbide (SiC) workpiece having various devices formed thereon. The sensor cell 232B (e.g., unshaded), for example, is open (e.g., not "blocked", where light 114 transmits through the workpiece and is received by sensor cell 232B), while the sensor cell 232A (e.g., shaded) is closed (e.g., "blocked", where light is substantially prevented from being received by sensor cell 232A by the workpiece). The workpiece 104 of FIG. 8, for example, is thus blocking some of the beam of light 114, while allowing some of the beam of light through at various radial positions. Thus, even though the workpiece 104 may be in a fixed position, varying percentages of the beam of light 114 are received along the array 234 of sensor cells 232A . . . 232n (e.g., due to the devices on the workpiece blocking the transmission of light therethrough).

In accordance with another example, the sensor output value is a ratio between the total number of sensor cells 232 and the number of cells that receive a signal from the beam of light 114. For example, in FIG. 9A, with twenty sensor cells 232A-232n, ten of the sensor cells are blocked and ten receive a signal. Accordingly, ten divided by a total of twenty sensor cells 232 yields 50% of the total transmitted signal 240 of FIG. 8 that is received.

In FIG. 9B, since some of the light is transmitted through the workpiece, when progressing in the direction of the arrow 238, a signal is received for the ten sensor cells 232K-232T, then sensor cell 232K is blocked, then a signal is received in sensor cell 232I, etc. Even though the workpiece is in the same position, six out of the twenty receivers are blocked, such as from devices, films, or a portion of the workpiece being slightly less transparent. FIG. 9C illustrates another example of sensor cells 232A-232n showing partial transmission through the workpiece where five out of twenty sensor cells are blocked.

The edge detection scheme described above, when viewing in the same direction as the arrow 238, determines the first sensor cell 232 that is blocked, whereby further sensor cells progressing beyond that blocked cell is also assumed to be blocked. Even if portions of light are transmitted through the workpiece beyond the first blocked sensor cell 232, such sensor cells are automatically assumed to be blocked, as well. However, as the workpiece 104 of FIG. 1 is rotated, for example, the location of the edge 118 may change. However, the edge 118 at least to blocks some of the light 114.

Thus, the present disclosure further provides the shallow angle 202 shown in FIG. 6 of the sensors (e.g., the transmission apparatus 108 and receiver apparatus 126), as well as multiple wavelengths of the light 114, and adjustable sensitivity of the sensors to more accurately determine the edge 118 of the workpiece 104. The first sensor cell 232 of FIG. 8 to be blocked may be due to a device formed on the workpiece 104, a transparent material or substrate of the workpiece, or the edge 118. For example, even a transparent material may not be 100% transparent, whereby even at the low end of transmission, the material may still block a small amount of light. By adjusting the sensitivity of the sensor cells 232, however, a command can be provided to not "make" or activate a sensor cell unless a predetermined amount of light is received, such as 80% of the light emitted. As such, even if the material of the workpiece 104 is semi-transparent, and 50% of the light passes through, the sensitivity can be adjusted to 80% of light as being required to activate the sensor cell, whereby if 50% is blocked, then that sensor cell can be considered to be blocked.

Accordingly, the present disclosure provides a combination of shallow angle sensors, variable sensitivity, and multiple wavelengths of light for determining an edge of a workpiece.

Figure 10:
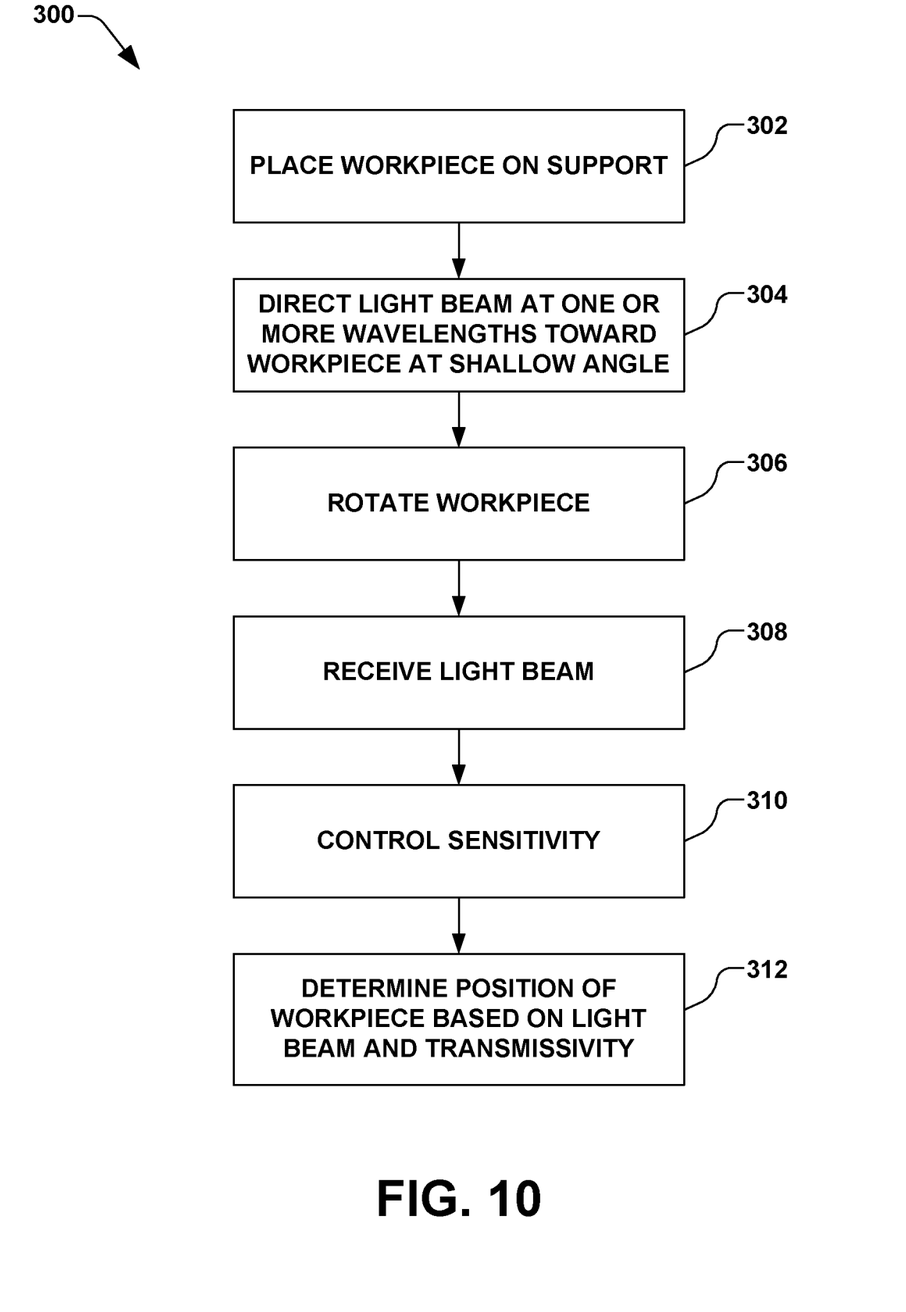
FIG. 10 is a block diagram illustrating an exemplary method for aligning workpieces according to another exemplary aspect of the disclosure.

In accordance with another exemplary aspect, a method 300 is provided for aligning a workpiece in FIG. 10. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

As illustrated in FIG. 10, the method 300 begins at act 302, wherein a workpiece is placed on a workpiece support. In act 304, a beam of light is directed toward a first side of the workpiece at one or more wavelengths along a first path. The beam of light, for example, is transmitted at a shallow angle with respect to the workpiece, whereby the light passes through a significantly larger amount of the workpiece than a thickness of the workpiece. The beam of light is further directed toward a periphery of the workpiece, and the workpiece is rotated about a support axis in act 306. The beam of light is further received concurrent with the rotation of the workpiece in act 308. A sensitivity of the beam of light is controlled or adjusted to provide a desired signal in act 310. A position of the workpiece with respect to the support axis is further determined in act 312. The determination of the position of the workpiece in act 312 is based, at least in part, on a rotational position of the workpiece about the support axis and the beam of light that is received, wherein the beam of light is proportioned according to the controlled sensitivity of the sensors and a transmissivity of the workpiece.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A workpiece alignment system, comprising:
a workpiece support having a support axis, wherein the workpiece support is configured to selectively support a workpiece along a workpiece plane;
a light emission apparatus configured to direct a beam of light at one or more wavelengths along a path toward a first side of the workpiece plane, wherein the beam of light is ribbon-shaped and has a width associated therewith, wherein the path is associated with a peripheral region of the workpiece, and wherein the path is at a shallow angle with respect to the workpiece plane;
a light receiver apparatus positioned along the path and configured to receive the beam of light on a second side of the workpiece plane, wherein the second side is opposite the first side, and wherein the light receiver apparatus comprises a plurality of sensor cells configured to receive a respective plurality of portions of the beam of light along the width of the beam of light, wherein the plurality of sensor cells are configured to define a plurality of received signals associated with the respective plurality of portions of the beam of light; and
a controller configured to determine an edge of the workpiece with respect to the support axis based, at least in part, on a differentiation of the plurality of received signals when the workpiece intersects the path, and wherein the controller is configured to control a sensitivity of the light receiver apparatus based on a transmissivity of the workpiece.

2. The workpiece alignment system of claim 1, further comprising a rotation device operably coupled to the workpiece support and configured to selectively rotate the workpiece support about the support axis, wherein the workpiece comprises an edge feature associated with the edge of the workpiece, and wherein the controller is further configured to determine a position of the workpiece with respect to the support axis based on a rotational position of the workpiece support and the differentiation of the plurality of received signals when the edge feature intersects the path.

3. The workpiece alignment system of claim 2, wherein the controller is further configured to determine a waveform, wherein the waveform is defined by the plurality of portions of the beam of light received by the light receiver at a plurality of rotational positions of the workpiece support, and wherein the controller is further configured to determine the position of the workpiece with respect to the support axis based on the waveform.

4. The workpiece alignment system of claim 3, wherein the controller is further configured to proportion the waveform based on the transmissivity of the workpiece.

5. The workpiece alignment system of claim 1, wherein the shallow angle is approximately 5 degrees from the workpiece plane.

6. The workpiece alignment system of claim 1, wherein the light emission apparatus comprises a laser configured to transmit the beam of light at the one or more wavelengths.

7. The workpiece alignment system of claim 1, wherein the controller is configured to determine a first blockage of the plurality of received signals when viewed from an outboard extent to an inboard extent of the width of the beam of light, and wherein the controller is configured to selectively ignore any of the plurality of received signals that are defined beyond the first blockage.

8. A workpiece alignment system, comprising:
a light emission apparatus configured to direct a beam of light at one or more wavelengths along a path toward a first side of a workpiece plane associated with a workpiece, wherein the path is associated with a peripheral region of the workpiece, and wherein the path is at a shallow angle with respect to the workpiece plane;
a light receiver apparatus positioned along the path and configured to receive the beam of light on a second side of the workpiece plane, wherein the second side is opposite the first side;
a workpiece support configured to selectively support the workpiece along the workpiece plane;
a rotation device operably coupled to the workpiece support and configured to selectively rotate the workpiece support about a support axis; and
a controller configured to determine a position of the workpiece with respect to the support axis based, at least in part, on an amount of the beam of light that is received by the light receiver apparatus when the workpiece intersects the path as the workpiece is rotated via the workpiece support, and wherein the controller is configured to control a sensitivity of the light receiver apparatus based on a transmissivity of the workpiece.

9. The workpiece alignment system of claim 8, wherein the shallow angle is approximately 5 degrees from the workpiece plane.

10. The workpiece alignment system of claim 8, wherein the light emission apparatus comprises a laser configured to transmit the beam of light at the one or more wavelengths.

11. The workpiece alignment system of claim 8, wherein the light emission apparatus is configured to transmit the beam of light at a plurality of wavelengths across a predetermined width thereof.

12. The workpiece alignment system of claim 8, wherein the position of the workpiece comprises a two-dimensional offset of a center of the workpiece from the support axis along the workpiece plane.

13. The workpiece alignment system of claim 12, wherein the position of the workpiece further comprises a rotational position of the workpiece about the support axis.

14. The workpiece alignment system of claim 13, wherein the workpiece comprises an edge feature, wherein the controller is configured to determine a rotational position of the workpiece with respect to the support axis based, at least in part the amount of the beam of light that is received by the light receiver apparatus when the edge feature intersects the path as the workpiece is rotated via the workpiece support.

15. The workpiece alignment system of claim 8, wherein the controller is configured to determine a waveform, wherein the waveform is defined by the at least a portion of the beam of light received by the light receiver at a plurality of rotational positions of the workpiece support, and wherein the controller is further configured to determine the position of the workpiece with respect to the support axis based on the waveform.

16. The workpiece alignment system of claim 15, wherein the controller is further configured to proportion the waveform based on the transmissivity of the workpiece.

17. The workpiece alignment system of claim 8, wherein the light receiver apparatus comprises a plurality of sensor cells configured to receive a respective plurality of portions of the beam of light along a width of the beam of light, wherein the plurality of sensor cells are configured to define a plurality of received signals associated with a respective plurality of portions of the beam of light, and wherein the controller is configured to determine an edge of the workpiece by selectively ignoring one or more of the plurality of received signals.

18. The workpiece alignment system of claim 17, wherein the controller is configured to determine a first blockage of the plurality of received signals when viewed from an outboard extent to an inboard extent of the width of the beam of light, and wherein the controller is configured to selectively ignore any of the plurality of received signals that are defined beyond the first blockage.

19. A method for aligning a workpiece, the method comprising:
   placing the workpiece on a workpiece support;
   directing a beam of light at a plurality of wavelengths toward a first side of the workpiece along first path, wherein the path is at a shallow angle with respect to a plane of the workpiece;
   rotating the workpiece about a support axis;
   receiving the beam of light that is transmitted toward the workpiece to a second side of the workpiece concurrent with the rotation of the workpiece; and
   determining a position of the workpiece with respect to the support axis based, at least in part, on a rotational position of the workpiece about the support axis and the beam of light that is received, a detection of an edge of the workpiece, and a controlled sensitivity of the beam of light.

20. The method of claim 19, wherein determining the position of the workpiece with respect to the support axis comprises determining one or more of a rotational position of the workpiece about the support axis and a two-dimensional offset of a center of the workpiece from the support axis.

* * * * *